United States Patent
Ito

(10) Patent No.: US 8,680,971 B2
(45) Date of Patent: Mar. 25, 2014

(54) WIRELESS IC DEVICE AND METHOD OF DETECTING ENVIRONMENTAL STATE USING THE DEVICE

(75) Inventor: Yuki Ito, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 175 days.

(21) Appl. No.: 13/421,889

(22) Filed: Mar. 16, 2012

(65) Prior Publication Data
US 2012/0176223 A1    Jul. 12, 2012

Related U.S. Application Data

(63) Continuation of application No. PCT/JP2010/066714, filed on Sep. 27, 2010.

(30) Foreign Application Priority Data

Sep. 28, 2009   (JP) .................................. 2009-223420

(51) Int. Cl.
*G08B 1/08* (2006.01)

(52) U.S. Cl.
USPC ...................... 340/10.4; 340/539.26; 340/602

(58) Field of Classification Search
USPC .......... 340/500, 531, 539.1, 539.26, 539.27, 340/539.28, 540, 601, 602, 657, 10.1, 10.4
See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A * | 8/2000 | Glover et al. ................. 361/700 |
| 6,107,920 A | 8/2000 | Eberhardt et al. |

(Continued)

FOREIGN PATENT DOCUMENTS

| | | |
|---|---|---|
| CA | 2 279 176 A1 | 7/1998 |
| DE | 10 2006 057 369 A1 | 6/2008 |

(Continued)

OTHER PUBLICATIONS

Official Communication issued in International Patent Application No. PCT/JP2009/069486, mailed on Mar. 2, 2010.

(Continued)

*Primary Examiner* — Andrew Bee
(74) *Attorney, Agent, or Firm* — Keating & Bennett, LLP

(57) ABSTRACT

In a wireless IC device, an insulating material, which has an electrical characteristic that is varied with a change in an environmental state, is provided between a feed circuit board and an antenna to detect the environmental state from a state of a communication characteristic between the wireless IC device and an external reader apparatus.

5 Claims, 6 Drawing Sheets

(56) References Cited

U.S. PATENT DOCUMENTS

| | | |
|---|---|---|
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,446,660 B2 * | 11/2008 | Posamentier ............ 340/572.1 |
| 7,551,058 B1 * | 6/2009 | Johnson et al. ........... 340/10.41 |
| 7,570,169 B2 * | 8/2009 | Li et al. ..................... 340/572.7 |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0070003 A1 | 3/2008 | Nakatani et al. |
| 2008/0087990 A1 | 4/2008 | Kato et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2011/0031320 A1 | 2/2011 | Kato et al. |
| 2011/0063184 A1 | 3/2011 | Furumura et al. |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |

(56) References Cited

FOREIGN PATENT DOCUMENTS

| | | |
|---|---|---|
| EP | 2 148 449 A1 | 1/2010 |
| EP | 2 251 934 A1 | 11/2010 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 9-512367 A | 12/1997 |
| JP | 10-069533 A | 3/1998 |
| JP | 10-69533 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-522849 A | 7/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |

(56) References Cited

FOREIGN PATENT DOCUMENTS

| | | |
|---|---|---|
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-187507 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-126750 A | 4/2004 |
| JP | 2004-127230 A | 4/2004 |
| JP | 2004-140513 A | 5/2004 |
| JP | 2004-163134 A | 6/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |

(56) References Cited

FOREIGN PATENT DOCUMENTS

| | | |
|---|---|---|
| JP | 2007-007888 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 2007-172369 A | 7/2007 |
| JP | 2007-172527 A | 7/2007 |
| JP | 2007-228325 A | 9/2007 |
| JP | 2007-233597 A | 9/2007 |
| JP | 2007-266999 A | 10/2007 |
| JP | 2007-272264 A | 10/2007 |
| JP | 2007-287128 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-097426 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160874 A | 7/2008 |
| JP | 2008-167190 A | 7/2008 |
| JP | 2008-197714 A | 8/2008 |
| JP | 2008-535372 A | 8/2008 |
| JP | 2008-207875 A | 9/2008 |
| JP | 2008-217406 A | 9/2008 |
| JP | 2008-288915 A | 11/2008 |
| JP | 2009-017284 A | 1/2009 |
| JP | 2009-25870 A | 2/2009 |
| JP | 2009-27291 A | 2/2009 |
| JP | 2009-044715 A | 2/2009 |
| JP | 3148168 U | 2/2009 |
| JP | 2009-110144 A | 5/2009 |
| JP | 2009-182630 A | 8/2009 |
| JP | 2010-009196 A | 1/2010 |
| JP | 2010-081571 | 4/2010 |
| JP | 4609604 B2 | 1/2011 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/138857 A1 | 12/2007 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/011144 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/081719 A1 | 7/2009 |
| WO | 2009/110381 A1 | 9/2009 |

OTHER PUBLICATIONS

Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High Frequency Device and Wireless IC Device", U.S. Appl. No. 13/094,928, filed Apr. 27, 2011
Dokai et al.: "Wireless IC Device", U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.

(56) References Cited

OTHER PUBLICATIONS

Nomura et al.: "Antenna and Wireless IC Device", U.S. Appl. No. 13/419,454, filed Mar. 14, 2012.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issed in counterpart International Application No. PCT/JP2008/056026, mailed Jul. 1, 2008.
Ikemoto.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device", U.S. Appl. No. 12/211,117, filed Sep. 16, 2008.
Kato et al.: "Antenna", U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400; filed on Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component For Wireless IC Device", U.S. Appl. No. 12/339,198, filed Dec. 19, 2008.
Ikemoto et al.: "Wireless IC Device", U.S. Appl. No. 11/851,651, filed Sep. 7, 2007.
Kataya et al.: "Wireless Ic Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 121861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382; filed on Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.

(56) References Cited

OTHER PUBLICATIONS

Kato et al.: "Antenna Device and Method of Setting Resonant Frequency of Antenna Device"; U.S. Appl. No. 13/272,365, filed Oct. 13, 2011.

Official Communication issued in International Patent Application No. PCT/JP2010/056812, mailed on Jul. 13, 2010.

Dokai et al.: "Optical Disc", U.S. Appl. No. 13/295,153, filed Nov. 14, 2011.

Official Communication issued in International Patent Application No. PCT/JP2010/057668, mailed on Aug. 17, 2010.

Osamura et al.: "Radio Frequency IC Device and Method of Manufacturing the Same"; U.S. Appl. No. 13/308,575, filed Dec. 1, 2011.

Official Communication issued in International Patent Application No. PCT/JP2010/069417, mailed on Dec. 7, 2010.

Kato: "Wireless IC Device and Coupling Method for Power Feeding Circuit and Radiation Plate"; U.S. Appl. No. 13/325,273, filed Dec. 14, 2011.

Official Communication issued in International Application No. PCT/JP2007/066007, mailed on Nov. 27, 2007.

Dokai et al.: "Wireless IC Device and Component for Wireless Ic Device"; U.S. Appl. No. 12/359,690, filed Jan. 26, 2009.

Dokai et al.: "Test System For Radio Frequency IC Devices and Method of Manufacturing Radio Frequency IC Devices Using The Same", U.S. Appl. No. 12/388,826, filed Feb. 19, 2009.

Official Communication issued in International Application No. PCT/JP2008/061955, mailed on Sep. 30, 2008.

Official Communication issued in International Application No. PCT/JP2007/066721, mailed on Nov. 27, 2007.

Official Communication issued in International Application No. PCT/JP2007/070460, mailed on Dec. 11, 2007.

Kato et al.: "Wireless IC Device"; U.S. Appl. No. 12/390,556, filed Feb. 23, 2009.

Kato et al.: "Inductively Coupled Module and Item With Inductively Coupled Module"; U.S. Appl. No. 12/398,497, filed Mar. 5, 2009.

Official Communication issued in International Patent Application No. PCT/JP2008/050945, mailed on May 1, 2008.

Kato et al.: "Article Having Electromagnetic Coupling Module Attached Thereto"; U.S. Appl. No. 12/401,767, filed Mar. 11, 2009.

Taniguchi et al.: "Antenna Device and Radio Frequency IC Device"; U.S. Appl. No. 12/326,117, filed Dec. 2, 2008.

Ofifice Communication issed in International Patent Application No. PCT/JP2008/061442, mailed on Jul. 22, 2008.

Kato et al.: "Container With Electromagnetic Coupling Module"; U.S. Appl. No. 12/426,369, filed Apr. 20, 2009.

Kato: "Wireless IC Device", U.S. Appl. No. 12/429,346, filed Apr. 24, 2009.

Official Communication issued in International Patent Application No. PCT/JP2009/056934, mailed on Jun. 30, 2009.

Kato et al.: "Wireless IC Device"; U.S. Appl. No. 12/903,242, filed Oct. 13, 2010.

Kato et al.: "Wireless IC Device"; U.S. Appl. No. 12/940,103, filed Nov. 5, 2010.

Kato et al.: "Wireless IC Device System and Method of Determining Authenticity of Wireless IC Device"; U.S. Appl. No. 12/940,105, filed Nov. 5, 2010.

Official Communication issued in International Patent Application No. PCT/JP2009/059669, mailed on Aug. 25, 2009.

Official Communication issued in International Patent Application No. PCT/JP2009/062181, mailed on Oct. 13, 2009.

Official Communication issued in corresponding Japanese Application No. 2010-501323, mailed on Apr. 6, 2010.

Kato et al.: "Component of Wireless IC Device and Wireless IC Device"; U.S. Appl. No. 12/944,099 filed Nov. 11, 2010.

Kato et al.: "Wireless IC Device and Manufacturing Method Thereof"; U.S. Appl. No. 12/961,599, filed Dec. 7, 2010.

Kataya et al.: "Radio Frequency IC Device and Electronic Apparatus"; U.S. Appl. No. 12/959,454, filed Dec. 3, 2010.

Ikemoto et al.: "Radio IC Device"; U.S. Appl. No. 12/981,582, filed Dec. 30, 2010.

Official Communication issued in International Patent Application No. PCT/JP2009/062801, mailed on Oct. 27, 2009.

Ikemoto et al.: "Wireless IC Device and Electronic Apparatus"; U.S. Appl. No. 13/022,695, filed Feb. 8, 2011.

Official Communication issued in International Patent Application No. PCT/JP2009/067778, mailed on Jan. 26, 2010.

Kato: "Wireless IC Device and Method for Manufacturing Same"; U.S. Appl. No. 13/022,693, filed Feb. 8, 2011.

Kato: "Wireless IC Device", U.S. Appl. No. 13/080,781, filed Apr. 6, 2011.

Official communication issued in counterpart European Application No. 08 77 7758, dated on Jun. 30, 2009.

Official communication issued in counterpart Japanese Application No. 2008-103741, mailed on May 26, 2009.

Official communication issued in counterpart Japanese Application No. 2008-103742, mailed on May 26, 2009.

Official communication issued in International Application No. PCT/JP2008/050358, mailed on Mar. 25, 2008.

Official communication issed in International Application No. PCT/JP2008/050356, mailed on Mar. 25, 2008.

Osamura et al.: "Packaging Material With Electromagnetic Coupling Module," U.S. Appl. No. 12/536,663, filed Aug. 6, 2009.

Osamura et al.: "Packaging Material With Electromagnetic Coupling Module," U.S. Appl. No. 12/536,669, filed Aug. 6, 2009.

Dokai et al.: "Wireless IC Device and Component for Wireless IC Device," U.S. Appl. No. 12/543,553, filed Aug. 19, 2009.

Shioya et al.: "Wireless IC Device," U.S. Appl. No. 12/551,037, filed Aug. 31, 2009.

Ikemoto: "Wireless IC Device and Manufacturing Method Thereof," U.S. Appl. No. 12/579,672, filed Oct. 15, 2009.

Official communication issued in International Application No. PCT/JP2008/058614, mailed on Jun. 10, 2008.

\* cited by examiner

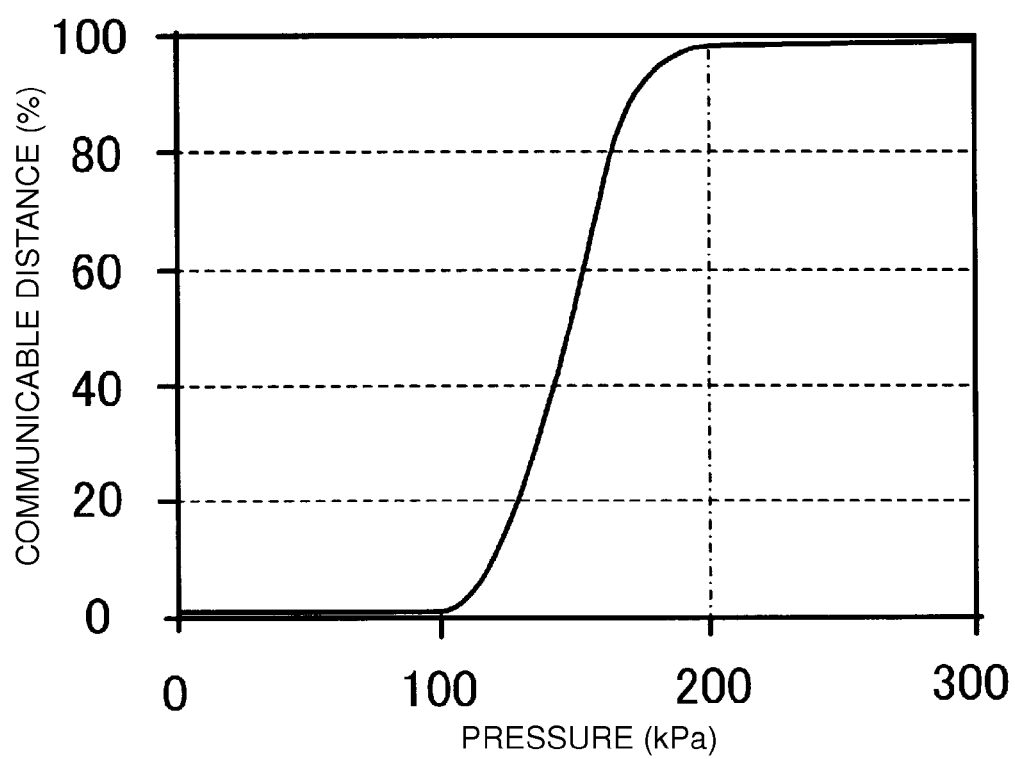

WIRELESS IC DEVICE AND METHOD OF DETECTING ENVIRONMENTAL STATE USING THE DEVICE

BACKGROUND OF THE INVENTION

1. Field of the Invention

The present invention relates to wireless IC devices. More particularly, the present invention relates to a wireless IC device capable of detecting an environmental state based on a state of a communication characteristic between the wireless IC device and an external reader apparatus. In addition, the present invention relates to a method of detecting an environmental state using the wireless IC device.

2. Description of the Related Art

In recent years, Radio Frequency Identification (RFID) technologies have been put into practical use and wireless IC devices having RFID integrated circuit (IC) chips mounted therein have been utilized for various individual identifications including merchandise control and employee ID cards.

Several methods are used for the RFID. For example, in wireless IC devices adopting passive methods, radio waves having certain frequencies transmitted from reader apparatuses (or reader-writer apparatuses) are received with antennas, RFID IC chips are driven by using the radio waves as power sources to extract information from the IC chips, the information is put on reflected waves from the wireless IC device to the reader apparatus, and the reflected waves including the information are transmitted to the reader apparatuses.

In addition, an approach has been made to use the RFID wireless IC devices for transmission of detection results in sensors that detect environmental states in recent years. For example, in a sensor system disclosed in Japanese Unexamined Patent Application Publication No. 2001-291181, a sensor detecting water leakage from pipes, a sensor detecting the humidity of the soil in a pot, or the like is combined with an RFID wireless IC device, radio waves from a reader apparatus are also used as a driving source for the sensor, the detection result in the sensor is put on reflected waves from the wireless IC device to the reader apparatus, and the reflected waves including the detection result in the sensor are transmitted to the reader apparatus.

However, since a minute change in an electrical characteristic based on a change in the environmental state is digitized and the data is transmitted by using communication components in the sensor system in related art disclosed in Japanese Unexamined Patent Application Publication No. 2001-291181, there is a problem in that the number of components is increased, which causes increases in cost and manufacturing complexity.

SUMMARY OF THE INVENTION

In view of the above problems, preferred embodiments of the present invention provide a wireless IC device including an RFID IC chip; a feed circuit board that has the IC chip mounted therein or thereon and that includes a feed circuit connected to the IC chip; and an antenna coupled to the feed circuit board. The wireless IC device communicates with an external reader apparatus via the antenna. An insulating material that has an electrical characteristic that is varied with a change in an environmental state to vary the coupling state between the feed circuit board and the antenna is provided between the feed circuit board and the antenna to detect the environmental state based on a state of a communication characteristic between the wireless IC device and the reader apparatus.

Since the wireless IC device according to a preferred embodiment of the present invention can be configured simply by providing the insulating material that has an electrical characteristic that is varied with a change in an environmental state between the feed circuit board and the antenna of an RFID wireless IC device, it is possible to configure a sensor system capable of detecting the environmental state in a non-contact manner from an external reader apparatus at a low cost without significantly increasing the number of components.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a graph showing the relationship between the pressure and the communicable distance of a wireless IC device according to a third preferred embodiment of the present invention.

DETAILED DESCRIPTION OF THE PREFERRED EMBODIMENTS

Preferred embodiments of the present invention will herein be described with reference to the attached drawings.

First Preferred Embodiment

Figure 1:
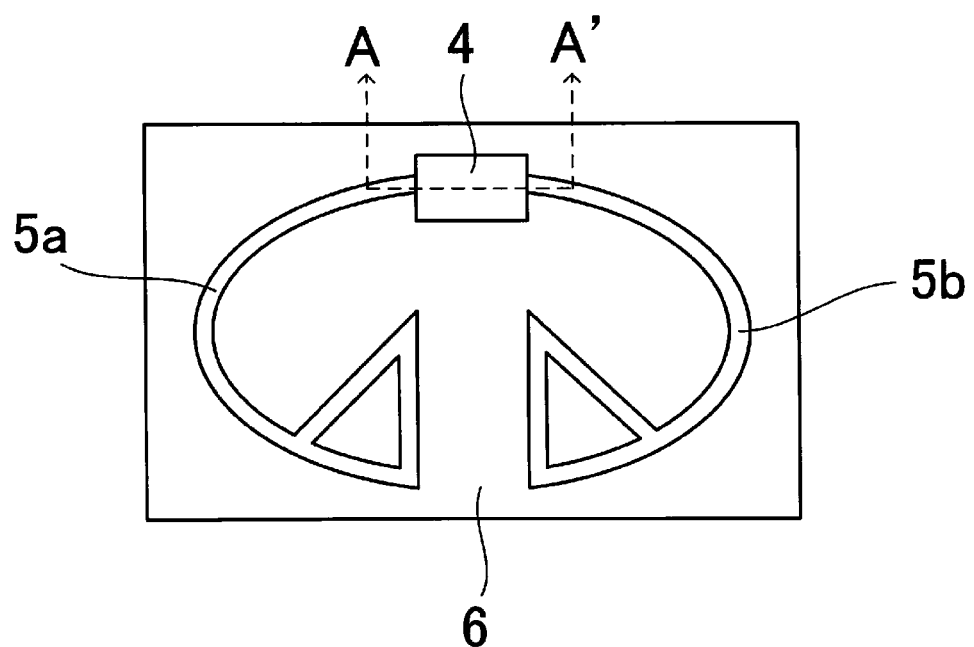
FIG. 1 is a plan view showing a wireless IC device according to a first preferred embodiment of the present invention.
Figure 2:
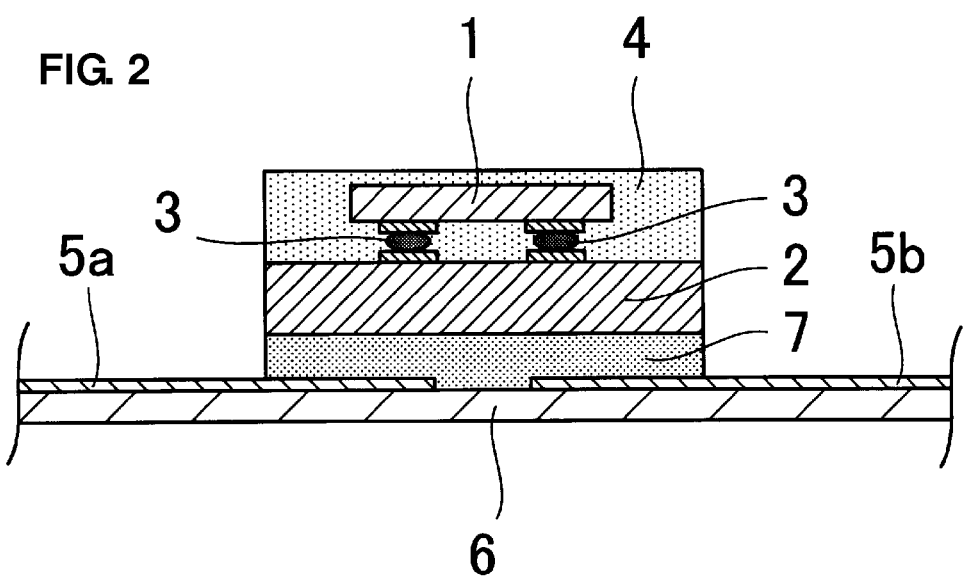
FIG. 2 is a partial cross-sectional view showing the wireless IC device according to the first preferred embodiment of the present invention, taken along a line A-A' in FIG. 1.

FIG. 1 and FIG. 2 show a wireless IC device according to a first preferred embodiment of the present invention. FIG. 1 is a plan view of the wireless IC device. FIG. 2 is a partial cross-sectional view of the wireless IC device taken along a line A-A' in FIG. 1.

Referring to FIGS. 1 and 2, reference numeral 1 denotes an RFID IC chip. The RFID IC chip 1 preferably includes a clock circuit, a logic circuit, a memory circuit, and so on, if needed, and stores necessary information, for example.

Reference numeral 2 denotes a feed circuit board. The feed circuit board 2 at least includes a feed circuit including electronic components included in the board and/or electronic components mounted on a surface of the board, although not shown in FIGS. 1 and 2. The IC chip 1 is mounted on the surface of the feed circuit board 2 by using bumps 3 and the IC chip 1 is connected to the feed circuit of the feed circuit board 2.

Reference numeral 4 denotes a covering resin. The covering resin 4 preferably is formed by, for example, arranging thermosetting resin on the feed circuit board 2 on which the IC chip 1 is mounted and hardening the thermosetting resin to protect the IC chip 1.

Reference numerals 5a and 5b denote antennas. The antennas 5a and 5b are made of a conductive material and have a certain pattern. The antennas 5a and 5b are preferably located on a surface of an insulating base 6 formed of, for example, a resin film. The antennas 5a and 5b are coupled to the feed circuit board 2 and are electromagnetically coupled to the feed circuit board 2 in the first preferred embodiment.

Reference numeral 7 denotes an insulating material featured in various preferred embodiments of the present invention. The insulating material 7 is preferably provided between the feed circuit board 2 and the antennas 5a and 5b. A material that has an electrical characteristic that is varied depending on a state of an environmental condition (including but not limited to humidity, temperature, pressure, for example) is preferably used as the insulating material 7.

In this wireless IC device, a radio wave having a certain frequency (for example, 900 MHz) transmitted from an external reader apparatus (or reader-writer apparatus) (not shown) is received with the antennas 5a and 5b, induced electromotive force is produced on the basis of the received radio wave in the feed circuit of the feed circuit board 2 electromagnetically coupled to the antennas 5a and 5b, the RFID IC chip 1 is driven with the electromotive force, and information is extracted from the IC chip 1. The extracted information is put on a reflected wave from the wireless IC device to the reader apparatus in the feed circuit and the reflected wave bearing the information is transmitted to the reader apparatus via the antennas 5a and 5b.

In the wireless IC device according to a preferred embodiment of the present invention, since the insulating material 7 that has an electrical characteristic that varies depending on a state of an environmental characteristic (including but not limited to humidity, temperature, pressure, etc., for example) is preferably provided between the feed circuit board 2 and the antennas 5a and 5b, the coupling state (the electromagnetic coupling state in the first preferred embodiment) between the feed circuit board 2 and the antennas 5a and 5b is varied depending on the environmental state. The variation in the coupling state between the feed circuit board 2 and the antennas 5a and 5b varies the communication characteristic between the wireless IC device and the reader apparatus. The environment around the wireless IC device is detected from the state of the communication characteristic between the wireless IC device and the reader apparatus in a preferred embodiment of the present invention.

In the first preferred embodiment, a material that has an electrostatic capacitance that is increased in response to an increase in the ambient humidity to vary the electromagnetic coupling between the feed circuit board 2 and the antennas 5a and 5b and to shift the communicable distance between the wireless IC device and the reader apparatus is preferably used as the insulating material 7. For example, epoxy resin in which cellulose is dispersed or epoxy resin in which polyvinyl alcohol is dispersed can be used as the insulating material 7.

Figure 3:
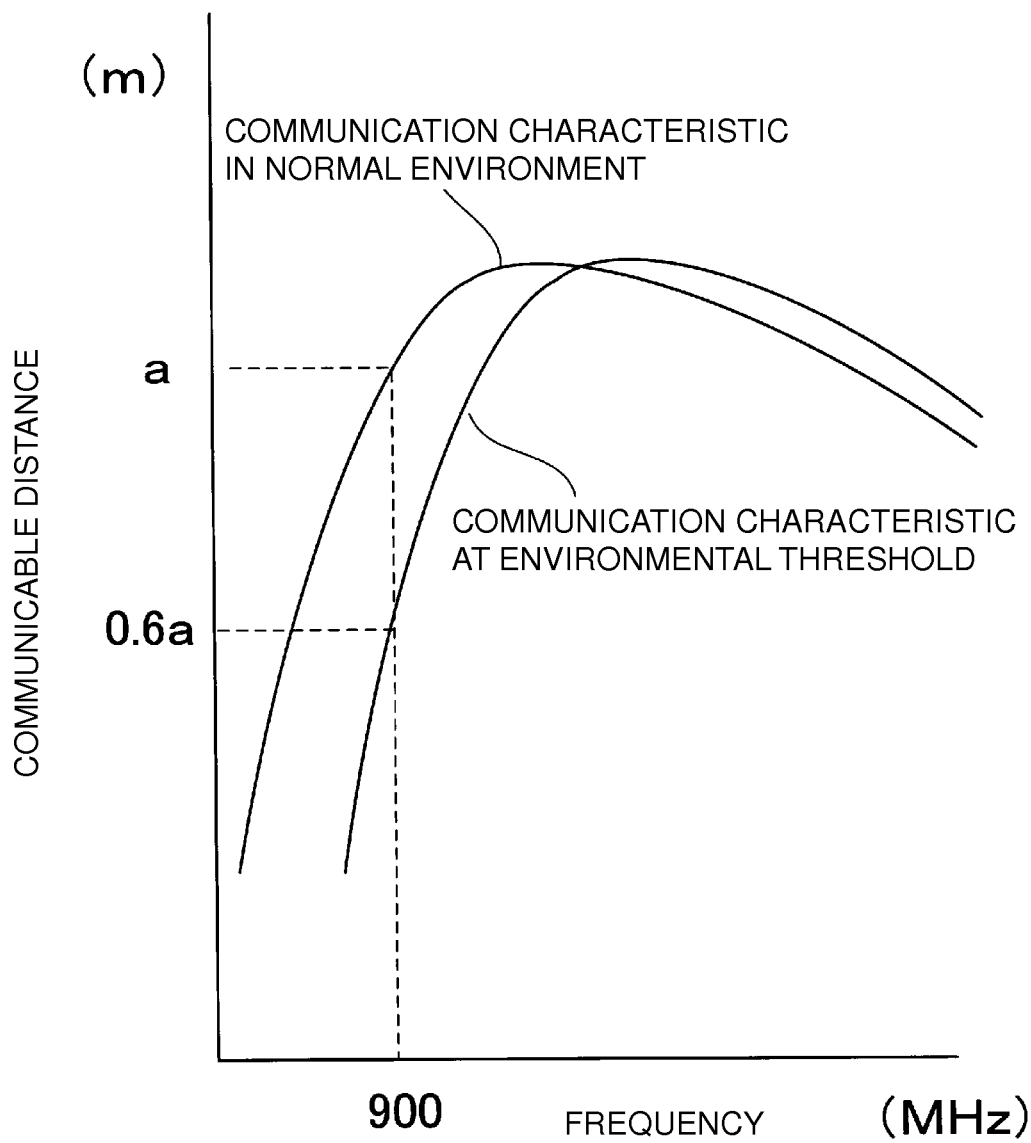
FIG. 3 is a graph showing communication characteristics (communicable distances) in a normal environment and at an environmental threshold in the wireless IC device according to the first preferred embodiment of the present invention.

FIG. 3 shows an exemplary relationship between the communicable distance between the wireless IC device and the reader apparatus and the humidity around the insulating material 7 at a specific frequency (for example, 900 MHz). Referring to FIG. 3, the communicable distance in a normal environment at a humidity of about 50% was equal to a meters while the communicable distance is decreased by about 40% to about 0.6 a meters at a humidity of about 90%, which is set as an environmental threshold. As a result, it is detected in the wireless IC device that the humidity is lower than about 90% if the communication between the wireless IC device and the reader apparatus is enabled at a communicable distance of about 0.6 a meters and that the humidity is not lower than about 90% if the communication between the wireless IC device and the reader apparatus is disabled at a communicable distance of about 0.6 a meters, for example.

Figure 4:
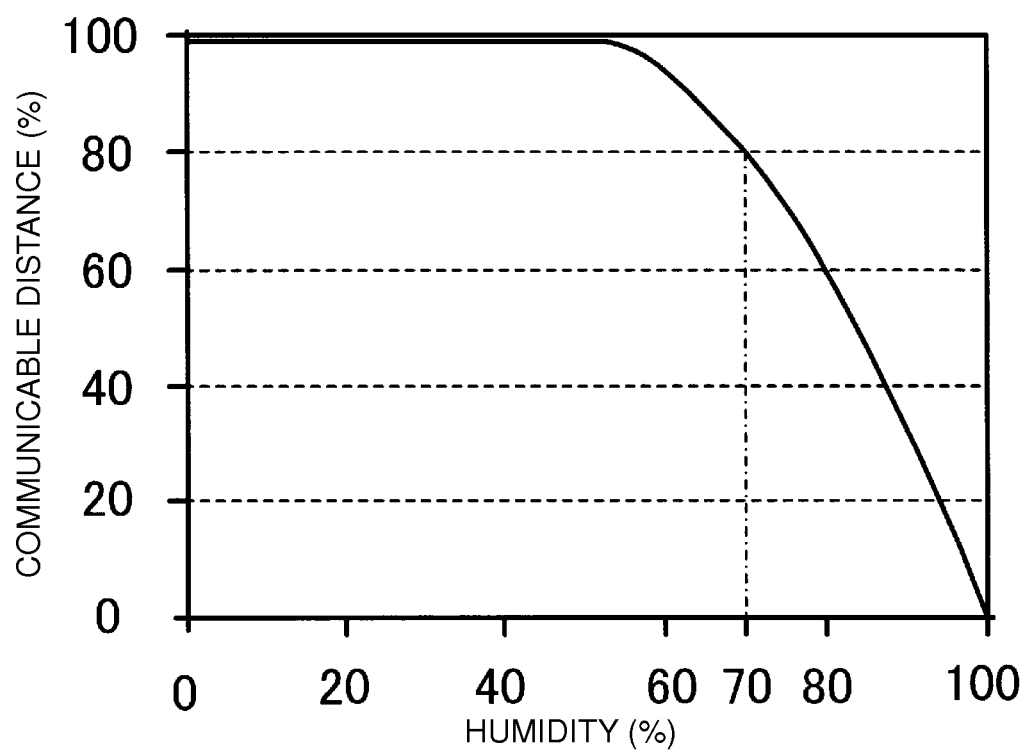
FIG. 4 is a graph showing the relationship between the humidity and the communicable distance of the wireless IC device according to the first preferred embodiment of the present invention.

The environmental threshold can be arbitrarily set. For example, when a humidity of about 70% is set as the environmental threshold, it can be detected whether the humidity is lower than about 70% based on whether the communication is enabled at a communicable distance that is actually measured in advance at a humidity of about 70%. For example, as shown in FIG. 4, when the communicable distance started to decrease around a humidity of about 55% or more and the communicable distance at a humidity of about 70% was about 80% of that at a humidity of about 55% or less, it can be detected that:

the humidity is lower than about 70% if the communicable distance was higher than about 80%;

the humidity is equal to about 70% (the environmental threshold) if the communicable distance was equal to about 80%; and the humidity is higher than about 70% if the communicable distance was lower than about 80%.

The humidity environment was designed in this example so that the electromagnetic coupling is optimized on the basis of the electrostatic capacitance at a humidity lower than about 55%, for example, at a humidity of about 40% and, when the humidity is increased to about 60% or more, the electrostatic capacitance is increased to increase the electromagnetic coupling, the electromagnetic coupling level is shifted from the optimal value, and the communicable distance is decreased. However, the method of setting the humidity environment is not limited to that described above. For example, the humidity environment may be designed so that the electromagnetic coupling is optimized on the basis of the electrostatic capacitance at a humidity of about 70% and, when the humidity is increased to be close to about 70%, the electrostatic capacitance is increased to increase the electromagnetic coupling and the electromagnetic coupling is optimized to increase the communicable distance.

Although the communicable distance is used as the communication characteristic in the present preferred embodiment, it may be detected whether the environmental state reaches the environmental threshold on the basis of another communication characteristic, for example, the amount of shift of a center frequency. When the environmental state preferably is detected on the basis of the amount of shift of the center frequency, it is desirable to perform the measurement for the wireless IC device in various aspects in order to increase the precision and accuracy of the measurement.

As described above, with the wireless IC device according to the first preferred embodiment, it is possible to detect the ambient humidity of the wireless IC device in a non-contact manner from an external reader apparatus at a low cost without largely increasing the amount of components.

Second Preferred Embodiment

In a wireless IC device in a second preferred embodiment, the insulating material 7 in the first preferred embodiment is replaced with a material that has an electrostatic capacitance that is increased in response to an increase in temperature. For example, a material produced from mixing a resin material (epoxy, etc.) with filler (barium titanate system, etc.) that has a dielectric constant that is varied with temperature may be preferably used. In other words, an increase in the ambient temperature increases the electrostatic capacitance to increase the electromagnetic coupling between the feed circuit board 2 and the antennas 5a and 5b, thereby varying the communicable distance between the wireless IC device and a reader apparatus.

Figure 5:
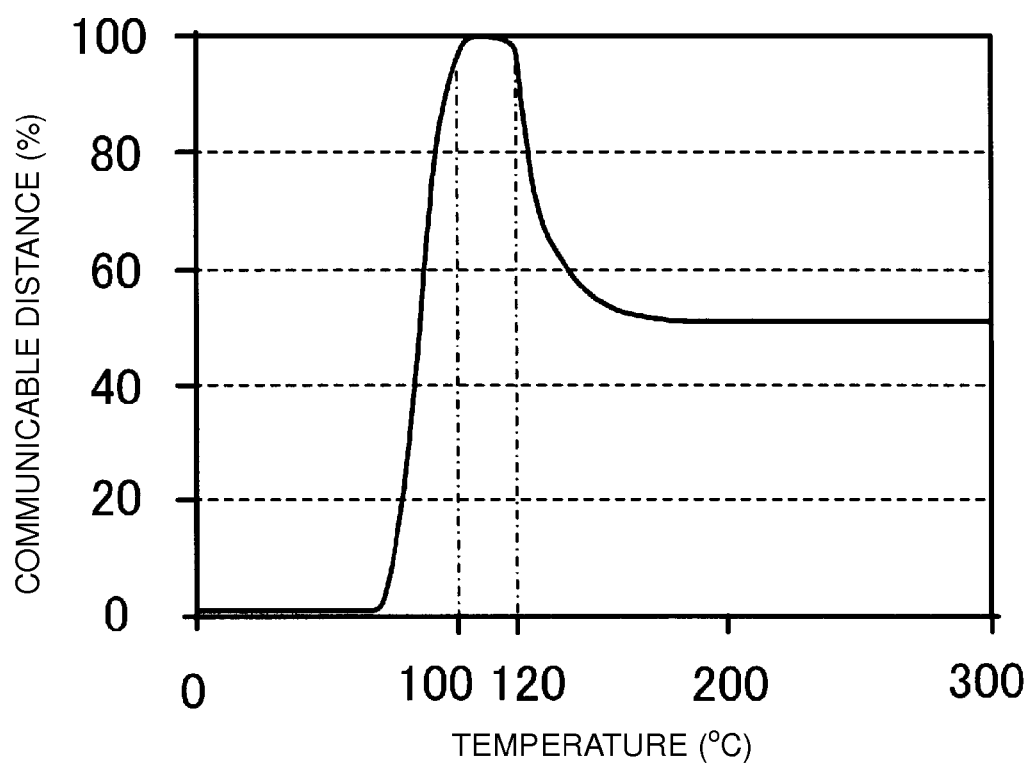
FIG. 5 is a graph showing the relationship between the temperature and the communicable distance of a wireless IC device according to a second preferred embodiment of the present invention.

If a predetermined temperature is set as the environmental threshold and the communicable distance at the predetermined temperature is actually measured, it can be detected whether the temperature is higher than or equal to the environmental threshold on the basis of whether the communication is enabled at the measured communicable distance. For example, if the environmental threshold was set to about 100° C. when the communication was disabled at room temperature, the electromagnetic coupling was optimized and the communicable distance was near 100% at temperatures of about 100° C. to about 120° C., and the electromagnetic coupling was reduced to decrease the communicable distance at a temperature of about 120° C. or more, as shown in FIG. 5, it can be detected from the communicable distance that is almost equal to 100% that the temperature exceeds the environmental threshold and is equal to about 100° C. to about 120° C.

Third Preferred Embodiment

In a wireless IC device in a third preferred embodiment, the feed circuit board 2 is not electromagnetically coupled to the antennas 5a and 5b but is directly coupled to the antennas 5a and 5b. In addition, the insulating material 7 in the first preferred embodiment is replaced with a material that electrically conducts in response to application of a pressure higher than or equal to an environmental threshold and that does not electrically conduct in response to application of a pressure lower than the environmental threshold. For example, "Inastomer" (a product name) manufactured by INABA RUBBER CO., LTD. may be used as such a material. It can be detected that the pressure is higher than or equal to the environmental threshold that is set if the communication is enabled between the wireless IC device and a reader apparatus and the pressure is lower than the environmental threshold that is set if the communication is disabled therebetween.

FIG. 6 shows an exemplary relationship between the pressure and the communicable distance of a wireless IC device the communicable distance of which is varied with the pressure. This example demonstrates that the pressure exceeds about 200 kPa if the communicable distance is almost equal to 100% and the pressure is lower than or equal to about 100 kPa if the communication is disabled.

Although the first to third preferred embodiments of the present invention are described above, the present invention is not limited to the above preferred embodiments and various modifications and applications can be made.

For example, if data indicating, for example, the location where the wireless IC device is installed and the type of a sensor (a humidity sensor in the first preferred embodiment, a temperature sensor in the second preferred embodiment, and a pressure sensor in the third preferred embodiment) is stored in advance in an RFID IC chip that is mounted and the data is read out by the reader apparatus concurrently with detection of the environmental state, it is possible to facilitate subsequent data processing without incorrect or inaccurate recognition of the detection result.

In addition, adjacently providing multiple kinds of wireless IC devices including the humidity sensor and the temperature sensor allows various environmental states to be easily detected with the same measurement system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless IC device comprising:
   an RFID IC chip;
   a feed circuit board that has the IC chip mounted therein or thereon and that includes a feed circuit connected to the IC chip; and
   an antenna coupled to the feed circuit board; wherein
   the wireless IC device communicates with an external reader apparatus via the antenna; and
   an insulating material that has an electrical characteristic that varies with a change in an environmental state to vary a coupling state between the feed circuit board and the antenna is provided between the feed circuit board and the antenna such that the environmental state is detected based on a state of a communication characteristic between the wireless IC device and the reader apparatus.

2. The wireless IC device according to claim 1, wherein the environmental state is one of humidity, temperature, and pressure.

3. The wireless IC device according to claim 1, wherein the feed circuit board is electromagnetically coupled to the antenna.

4. The wireless IC device according to claim 1, wherein the communication characteristic is a communicable distance between the wireless IC device and the reader apparatus.

5. A method of detecting an environmental state using a wireless IC device that includes an IC chip, a feed circuit board that has the IC chip mounted therein or thereon and that includes a feed circuit connected to the IC chip, and an antenna coupled to the feed circuit board; and communicates with an external reader apparatus via the antenna, wherein an insulating material that has an electrical characteristic that varies with a change in an environmental state to vary a coupling state between the feed circuit board and the antenna is provided between the feed circuit board and the antenna to enable detection of the environmental state based on a state of a communication characteristic between the wireless IC device and the reader apparatus.

* * * * *